United States Patent [19]
Ueno

[11] Patent Number: 6,096,607
[45] Date of Patent: Aug. 1, 2000

[54] METHOD FOR MANUFACTURING SILICON CARBIDE SEMICONDUCTOR DEVICE

[75] Inventor: Katsunori Ueno, Kanagawa, Japan

[73] Assignee: Fuji Electric Co., Ltd., Japan

[21] Appl. No.: 09/135,123

[22] Filed: Aug. 17, 1998

[30] Foreign Application Priority Data

Aug. 18, 1997 [JP] Japan .................................... 9-221244

[51] Int. Cl.[7] .......................... H01L 21/336; H01L 21/76
[52] U.S. Cl. ......................... 438/268; 438/433; 438/522; 438/542
[58] Field of Search .................................. 438/268, 433, 438/931, 522, 542, 140

[56] References Cited

U.S. PATENT DOCUMENTS

| | | | |
|---|---|---|---|
| 5,654,208 | 8/1997 | Harris et al. ............................. | 438/522 |
| 5,753,938 | 5/1998 | Tahpar et al. ............................. | 257/77 |
| 5,804,482 | 9/1998 | Konstantinov et al. ................. | 438/268 |
| 5,977,564 | 11/1999 | Kobayashi et al. ....................... | 257/77 |

OTHER PUBLICATIONS

J.N. Shenoy et al., "High–Voltage Double–Implanted Power MOSFET's in 6SH–SiC", Mar. 1997, pp. 93–95, IEEE Electron Device Letters, vol. 18 No.3.

C.E. Weitzel et al., "Silicon Carbide High–Power Devices", Oct. 1996, pp. 1732–1741, IEEE Transactions on Electron Devices, vol. 43, No. 10.

*Primary Examiner*—Richard Elms
*Assistant Examiner*—Michael S. Lebentritt
*Attorney, Agent, or Firm*—Rossi & Associates

[57] ABSTRACT

A method for manufacturing a silicon carbide semiconductor device having pn junctions is provided wherein a recessed portion is formed in a certain pattern in a surface of a substrate formed of a silicon carbide crystal, and an epitaxial layer having a conductivity type opposite to that of the substrate is grown on the substrate, and the surface of the surface is flattened so that the pn junctions appear on the surface of the substrate.

12 Claims, 11 Drawing Sheets

METHOD FOR MANUFACTURING SILICON CARBIDE SEMICONDUCTOR DEVICE

FIELD OF THE INVENTION

The present invention relates to semiconductor devices having pn junctions, which use silicon carbide as a semiconductor material, and a method for manufacturing such semiconductor devices.

BACKGROUND OF THE INVENTION

Silicon carbide (which will be referred to as SiC) has a wide band gap, and its maximum breakdown electric field is larger than that of silicon (which will be referred to as Si) by one order of magnitude. Thus, SiC has been highly expected to be used as a material for power semiconductor devices in the next generation. Various types of electron devices have been manufactured using a wafer of a single crystal, such as 4H—SiC or 6H—SiC, and, in particular, the use of such a single-crystal wafer has been considered important when applied to high-temperature, power devices. The single crystal as indicated above is formed as alpha-phase SiC in which a zinc-blende structure and a wurtzite structure are superposed on each other. In addition, a beta-phase SiC crystal called 3C—SiC is known. Using the alpha-phase or beta-phase SiC crystal, various types of semiconductor devices, including Shottky diode, vertical MOSFET, and thyristor, which may be used as power devices, and CMOS-IC as a general-purpose semiconductor device, have been fabricated and tested in recent years, and it has been confirmed that these devices exhibit far more excellent characteristics than conventional Si semiconductor devices. (Refer to Weitzel, C. W. et al.: IEEE Trans. on Electron Devices, vol. 43, No. 10, pp. 1732–1741 (1997)).

As one example of known SiC semiconductor devices, the structure of a vertical MOSFET and a method for manufacturing the MOSFET will be explained below.

FIG. 9(a) is a cross-sectional view of a unit cell of a trench type MOSFET. In the structure shown in FIG. 9(a), n source region 13 is formed in a surface layer of p base region 12 laminated on n drift layer 11b, and a trench 14 is formed such that it extends from the surface of the substrate into the n drift layer 11b. Gate electrode layer 16 is formed or embedded within the trench 14 with a gate oxide film 15 interposed between the electrode layer 16 and the inner wall of the trench 14.

With this arrangement, when a voltage is applied to the gate electrode layer 16, channels 20 are induced in surface portions of the p base regions 12 which face the gate electrode layer 16, so that the n source regions 13 and the n drift layer 11b are electrically shortened. As a result, current is allowed to flow from drain electrode 18 formed on the rear surface of $n^+$ substrate 11a under the n drift layer 11b, to source electrode 17 formed on the surface of the n source regions 13. When the voltage applied to the gate electrode layer 16 is removed, the drain electrode 18 and source electrode 17 are electrically disconnected from each other. Thus, the vertical MOSFET of FIG. 9 performs a switching function with voltage applied to or removed from the gate electrode layer 16.

FIG. 10(a) through FIG. 10(e) and FIG. 11(a) through FIG. 11(c) are cross-sectional views showing the flow of the process of fabricating the structure as described above. The process shown in these figures is only a part of the whole process of producing the semiconductor device, in particular, a process of forming junctions which is associated with the present invention.

Initially, n drift layer 11b having high resistance and p base layer 12 are epitaxially grown on $n^+$ substrate 11a, as shown in FIG. 10(a). Then, a polycrystalline silicon (polysilicon) layer 1 is deposited on the p base layer 12 by reduced-pressure CVD, and patterned by photolithography, to provide a mask. Using the mask thus formed, n-type impurities, such as phosphorous ions 13a, are implanted into the p base layer 12, as shown in FIG. 10(b). In this figure, reference numeral 13b denotes phosphorous atoms implanted in this manner.

After removing the mask, heat treatment is conducted to activate the implanted impurities, thereby to form n source region 13, as shown in FIG. 10(c).

Aluminum film 2 that provides an etching mask material is applied by sputtering to the surfaces of the p base layer 12 and n source region 13, and patterned by photolithography. By using the patterned aluminum film 2 as a mask, trench 14 is formed by plasma etching using carbon tetrafluoride ($CF_4$) and oxygen, to a depth that reaches the inside of the n drift layer 11b.

Gate insulating film 15 which consists of a silicon dioxide film (hereinafter referred to as $SiO_2$ film) is formed by thermal oxidation on the inner wall of the trench 14 and the surface of the SiC substrate, as shown in FIG. 11(a). Thereafter, a polycrystalline silicon layer is deposited in the trench 14 and patterned by photolithography, thereby to provide gate electrode layer 16, as shown in FIG. 11(b).

Subsequently, phosphorous glass is deposited by reduced-pressure CVD to provide an interlayer insulating film 19, and openings or windows are formed through the insulating film 19, so that source electrodes 17 are formed in contact with the n source regions 13. Although not illustrated in FIG. 11(c), drain electrode is formed on the rear surface of the $n^+$ substrate 11a.

The use of the SiC substrate suffers from two problems, namely, (1) impurities that are introduced into the SiC substrate by ion implantation are less likely to be activated, and (2) the impurities introduced by ion implantation hardly diffuses in the SiC substrate, though these problems do not arise when a silicon substrate is employed. Accordingly, it is easier to produce the trench type MOSFET that can be formed by epitaxial growth, rather than diffusion of impurities.

The above-described trench structure is also advantageously employed by Si devices. This is because the channel regions 20 are formed in the vertical direction in this structure, and therefore cells each performing a switching function can be closely positioned with high density, which leads to an improved area efficiency of the substrate, and improved characteristics of the device due to its geometry.

Recently, Shenoy, J. N. and others reported fabrication of a planar type MOSFET having a high breakdown voltage (as disclosed in IEEE Electron Device Lett., 18(3), 93(1997). FIG. 9(b) is a cross-sectional view showing a unit cell of the MOSFET.

In FIG. 9(b), p base regions 22 are formed in a surface layer of n drift layer 21b that is laminated on $n^+$ substrate 21a, and n source regions 23 are formed in surface layers of the p base regions 22. Gate electrode layer 26 is formed on gate insulating film 25 which is formed on the surface of exposed portions of the p base regions 22 and n drift layer 21b that are interposed between two n source regions 23. Source electrode 27 is formed on the n source regions 23, and drain electrode 28 is formed on the rear surface of the $n^+$ substrate 21a.

In this case, too, when a voltage is applied to the gate electrode layer 26, channels 30 are induced in surface portions of the p base regions 22 located right under the gate electrode layer 26, so that current is allowed to flow from the drain electrode 28 to the source electrode 27. When the voltage applied to the gate electrode layer 26 is removed, the drain electrode 28 and the source electrode 27 are electrically disconnected from each other. Thus, the cell of the vertical MOSFET of FIG. 9(b) performs a switching function with voltage applied to or removed from the gate electrode layer 26.

FIG. 12(a) through FIG. 12(g) are cross-sectional views showing the flow of the process of fabricating the structure of FIG. 9(b) as described above. The process shown in these figures is only a part of the whole process of producing the semiconductor device, in particular, a process of forming junctions which is associated with the present invention.

Initially, polycrystalline silicon film 1 as a mask material is formed on a high-resistance drift layer 21b that is formed by epitaxial growth on the surface of n$^+$ substrate 21a, and then patterned by photography into a desired shape, as shown in FIG. 12(a).

Subsequently, boron ions 22a are implanted at 650° C., as shown in FIG. 12(b). In this step, the acceleration voltage is set to the maximum level of 360 keV, so as to enable multilayer ion implantation. In FIG. 12(b), reference numeral 22b denotes implanted boron atoms.

After removing the polycrystalline silicon film 1, a second mask is formed from a Cr—Au film 3, and nitrogen ions 23a as n-type impurities are implanted using the second mask, as shown in FIG. 12(c). Reference numeral 23b denotes nitrogen ions thus implanted. The impurity atoms implanted in this manner are activated by carrying out heat treatment at 1600° C. for 30 min., so as to form p base regions 22 and n source regions 23, as shown in FIG. 12(d).

In the next step of FIG. 12(e), a silicon dioxide film hereinafter referred to as SiO$_2$ film) having a thickness of 48 nm is formed by thermal oxidation, to provide gate insulating film 25. A polycrystalline silicon film is then deposited on the gate insulating film 25, and patterned by photolithography into a desired shape, to thus provide gate electrode layer 26, as shown in FIG. 12(f).

Subsequently, phosphorous glass is deposited by reduced-pressure CVD to provide interlayer insulating film 29, and windows are formed through the insulating film 29, so that source electrodes 27 are formed in contact with the n source regions 23. Although not illustrated in FIG. 12, drain electrode is formed on the rear surface of the n$^+$ substrate 21a.

When forming the p base regions 22 and n source regions 23 according to the above-described method, impurities are implanted to a relatively large depth, by increasing the acceleration voltage during ion implantation, so as to solve the problem of diffusion of the impurities as described above.

The trench-type MOSFET as shown in FIG. 9(a) suffers from a structural problem that an electric field is concentrated at corner portions of the trench. Since SiC used as a semiconductor material, in particular, has a far larger electric field strength than silicon, a relatively large electric field is applied to the corner portions of the gate insulating film 15 formed in the trench. This may result in a fatal problem that dielectric breakdown of the oxide film takes place at the corner portions, and normal breakdown voltage characteristics cannot be obtained.

The boundary condition of the electric field strength at the interface between the semiconductor and the gate insulating film upon application of voltage is represented by:

$$\epsilon i E i = \epsilon s E s \qquad (1)$$

where $\epsilon i$, $\epsilon s$ are dielectric constants of the gate insulating film and semiconductor, respectively, and Ei, Es are electric field strengths of the gate insulating film and semiconductor, respectively. From the boundary condition as indicated above, the electric field of the gate insulating film is represented by the following equation.

$$Ei = \frac{\epsilon s}{\epsilon i} \cdot Es$$

Since $\epsilon s$ of Si is 11.7 and $\epsilon i$ of the SiO$_2$ film is 3.8, an electric field which is about 3 times as much as that of Si substrate is applied to the gate insulating film where a breakdown electric field is applied to the Si substrate. On the other hand, $\epsilon s$ of SiC is 10.2, which is not so different from that of Si, but its breakdown electric field is larger than that of Si by about one order of magnitude, as mentioned above. In the SiC device, therefore, an electric field that is ten times as high as that in the case of the Si device is applied to the gate insulating film.

Furthermore, the trench structure as shown in FIG. 9(a) includes corner portions. Since the electric field is concentrated at the corner portions, the SiC device cannot take advantage of its inherent characteristic of high breakdown electric field. Namely, as the voltage applied to the device is increased, the gate insulating film reaches its breakdown electric field before the semiconductor reaches its breakdown electric field, thus causing the device to break down.

In the planar type MOSFET as shown in FIG. 9(b), on the other hand, no corner portion is present, unlike the trench-type MOSFET, and therefore excessive concentration of an electric field does not take place. Thus, the planar type MOSFET is free from the problem of the breakdown voltage of the oxide film as encountered in the trench structure.

In the planar type MOSFET, however, ions, in particular, p type ions, need to be implanted at 600° C. or higher, and heat treatment at 1500° C. or higher is required for activating the ions thus implanted. While SiO$_2$ film is normally used as a gate insulating film, and polycrystalline silicon is used for forming a gate electrode, the SiO$_2$ film softens at 1300° C. or higher, and polycrystalline silicon has a fusing point of 1412° C. Where the SiO$_2$ film and polycrystalline silicon are used to provide the gate insulating film and gate electrode layer, therefore, heat treatment cannot be conducted at such a high temperature as indicated above after these film and layer are formed. Also, a mask used for ion implantation must be made of a heat resisting material, and therefore the process of forming a wafer is tremendously limited or restricted.

In order to form deep junctions through ion implantation, the acceleration voltage needs to be increased. However, the depth of the junctions formed by ion implantation can be only 0.5 μm even if the ions are implanted with the acceleration voltage of 300 keV. It is thus difficult to realize pn junctions having a sufficiently large depth even if the acceleration voltage is increased. In addition, radioactive rays may radiate during a high-energy ion implantation, and an expensive implantation apparatus may be needed to perform the high-energy ion implantation.

SUMMARY OF THE INVENTION

It is therefore an object of the present invention to provide a method for manufacturing a silicon carbide semiconductor device, wherein a high breakdown voltage can be easily achieved.

To accomplish the above object, the present invention provides a method for manufacturing a silicon carbide semiconductor device having a pn junction, comprising the steps of: forming a recessed portion in a surface of a semiconductor substrate in a predetermined pattern, the semiconductor substrate comprising a silicon carbide crystal; growing an epitaxial layer on the semiconductor substrate, the epitaxial layer having a conductivity type opposite to that of the semiconductor substrate; and flattening the surface of the semiconductor substrate so that the pn junction appears on the surface of the substrate.

According to the method as described above, planar type SiC semiconductor device having deep pn junctions can be easily produced, even though it is normally difficult to form deep pn junctions in SiC semiconductor devices.

The present invention also provides a method for manufacturing a silicon carbide MOSFET in particular, comprising the steps of: forming a recessed portion in a surface of a first conductivity type substrate in a predetermined pattern, the semiconductor substrate comprising a silicon carbide crystal; growing a second conductivity type epitaxial layer on the substrate; and flattening at least a part of the substrate by removing a surface portion of the substrate including a part of the epitaxial layer grown thereon, so that pn junctions appear on a surface of the substrate, and so that the second conductivity type epitaxial layer is formed into a second conductivity type base region.

According to the method as described above, planar type SiC MOSFET having deep pn junctions can be produced which is free from a problem encountered in trench type MOSFET, namely, insulating breakdown occurring at corner portions of an oxide film due to concentration of an electric field.

In a preferred form of the invention, the method for manufacturing a silicon carbide MOSFET may further include the steps of: implanting impurities for forming a first conductivity type region in a surface layer of the second conductivity type epitaxial layer; conducting heat treatment to activate the impurities introduced by ion implantation, so as to form a first conductivity type source region; forming an oxide film on a flattened surface of the substrate by thermal oxidation; forming a gate electrode layer on the oxide film; forming a source electrode to be in contact with the first conductivity type source region; and forming a drain electrode to be in contact with a rear surface of the first conductivity type silicon carbide substrate. In another preferred form of the invention, the method may further include the steps of: implanting impurities for forming a first conductivity type region in a surface layer of the second conductivity type epitaxial layer; flattening at least a part of the substrate by removing a surface portion of the substrate including a part of the epitaxial layer grown thereon, so that pn junctions appear on the surface of the substrate, and so that the second conductivity type epitaxial layer is formed into a second conductivity type base region; conducting heat treatment to activate the impurities introduced by ion implantation, so as to form a first conductivity type source region; forming an oxide film on a flattened surface of the substrate by thermal oxidation; forming a gate electrode layer on the oxide film; forming a source electrode to be in contact with the first conductivity type source region; and forming a drain electrode to be in contact with a rear surface of the first conductivity type silicon carbide substrate. In the latter method, in particular, the channel length can be controlled utilizing self alignment.

In a further preferred form of the invention, the method for manufacturing a silicon carbide MOSFET further includes the steps of: epitaxially growing a first conductivity type high concentration layer on the second conductivity type epitaxial layer; flattening at least a part of the substrate by removing a surface portion of the substrate including apart of the epitaxial layer grown thereon, so that pn junctions appear on the surface of the substrate, and so that the second conductivity type epitaxial layer is formed into a second conductivity type base region while the first conductivity type high concentration layer is formed into a first conductivity type source region; forming an oxide film on a flattened surface of the substrate by thermal oxidation; forming a gate electrode layer on the oxide film; forming a source electrode to be in contact with the first conductivity type source region; and forming a drain electrode to be in contact with a rear surface of the first conductivity type silicon carbide substrate. In this manner, a planar type SiC MOSFET having deep pn junctions can be manufactured. Furthermore, the MOSFET can be produced without using ion implantation, and the channel length can be controlled utilizing self alignment.

Another method for manufacturing a silicon carbide MOSFET may include the steps of: covering a portion of the first conductivity type silicon carbide substrate with a mask, and forming the recessed portion to a predetermined depth by etching; epitaxially growing the second conductivity type epitaxial layer on the substrate; flattening at least a part of the substrate by removing a surface portion of the substrate including a part of the epitaxial layer grown thereon, so that the pn junction appears on the surface of the substrate, and so that the second conductivity type epitaxial layer is formed into a second conductivity type base region; forming a first conductivity type epitaxial layer on the surface of the substrate; implanting impurities for forming a first conductivity type region in selected portions of a surface layer of the first conductivity type epitaxial layer; conducting heat treatment to activate the impurities introduced by ion implantation, so as to form a first conductivity type source region; forming an oxide film by thermal oxidation on a surface of the first conductivity type epitaxial layer; forming a gate electrode layer on the oxide film; forming a source electrode to be in contact with the first conductivity type source region; and forming a drain electrode to be in contact with a rear surface of the first conductivity type silicon carbide substrate.

A further method for manufacturing a silicon carbide MOSFET may include the steps of: covering a portion of the first conductivity type silicon carbide substrate with a mask, and forming the recessed portion to a predetermined depth by etching; epitaxially growing the second conductivity type epitaxial layer on the substrate; laminating a first conductivity type high concentration layer by epitaxial growth on the surface of the substrate; flattening at least a part of the substrate by removing a surface portion of the substrate including a part of the epitaxial layer grown thereon, so that pn junctions appear on the surface of the substrate, and so that the second conductivity type epitaxial layer is formed into a second conductivity type base region while the first conductivity type high concentration layer is formed into a first conductivity type source region; laminating a first conductivity type epitaxial layer on the surface of the substrate; forming an oxide film by thermal oxidation on the surface of the first conductivity type epitaxial layer; forming a gate electrode layer on the oxide film; forming a source electrode to be in contact with the first conductivity type source region; and forming a drain electrode to be in contact with a rear surface of the first conductivity type silicon carbide substrate.

According to the above two methods as described above, planar type SiC MOSFET which is of depletion type and has deep pn junctions can be manufactured. Since a channel region is provided by an epitaxial layer which does not have many crystal defects, the operating characteristics of the MOSFET are improved. In the latter method, in particular, the MOSFET can be produced without carrying out ion implantation.

Preferably, the thickness of the first conductivity type epitaxial layer is controlled to be in a range of 0.1 to 1 μm. In this case, the channel region can be depleted with a relative low voltage.

The present invention also provides a method for manufacturing a CMOS semiconductor device, covering a portion of a first conductivity type silicon carbide substrate with a mask, and forming a recessed portion to a predetermined depth by etching; growing a second conductivity type epitaxial layer on the substrate; flattening at least a part of the substrate by removing a surface portion of the substrate including a part of the epitaxial layer grown thereon, so that a pn junction appears on the surface of the substrate, and so that the second conductivity type epitaxial layer is formed into a second conductivity type well region; implanting impurities for forming a first conductivity type region in a surface layer of the second conductivity type well region; conducting heat treatment to activate the impurities introduced by ion implantation, so as to form a first conductivity type source region and a first conductivity type drain region; implanting impurities for forming a second conductivity type region in a flattened surface layer of the first conductivity type silicon carbide substrate; conducting heat treatment to activate the impurities introduced by ion implantation, so as to form a second first conductivity type source region and a second conductivity type drain region; forming an oxide film on the surface of the substrate by thermal oxidation; forming gate electrode layers on the oxide film; and forming electrodes which are in contact with the first conductivity type source region, first conductivity type drain region, second conductivity type source region, and the second conductivity type drain region.

According to the method as described above, a planar type CMOS semiconductor device having a deep well region can be advantageously manufactured.

The surface of the SiC substrate may be flattened by mechanical polishing, or by dry etching using plasma. If dry etching using plasma is employed, no crystal defects appear on the surface layer of the substrate after the etching step, though the surface may be flattened by either of the above two methods.

BRIEF DESCRIPTION OF THE DRAWINGS

The invention will be described in greater detail with reference to preferred embodiments thereof and the accompanying drawings, wherein.

DETAILED DESCRIPTION OF THE PREFERRED EMBODIMENTS

Figure 11A:
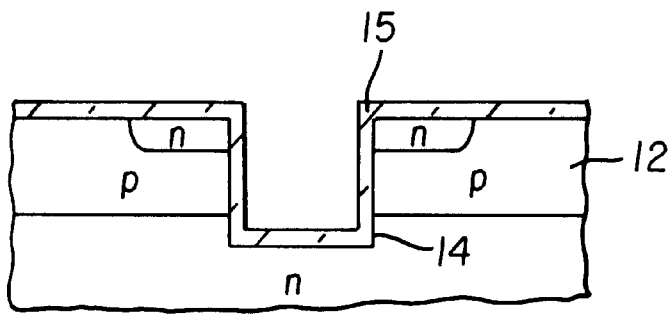
FIG. 11(a) through FIG. 11(c) are cross-sectional views showing process steps of the method for manufacturing the known trench type MOSFET, following the process step of FIG. 10(e)
Figure 11B:
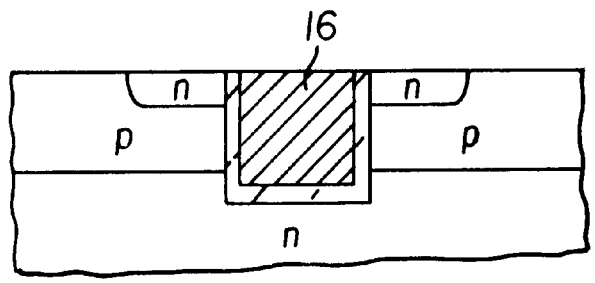
Figure 11C:
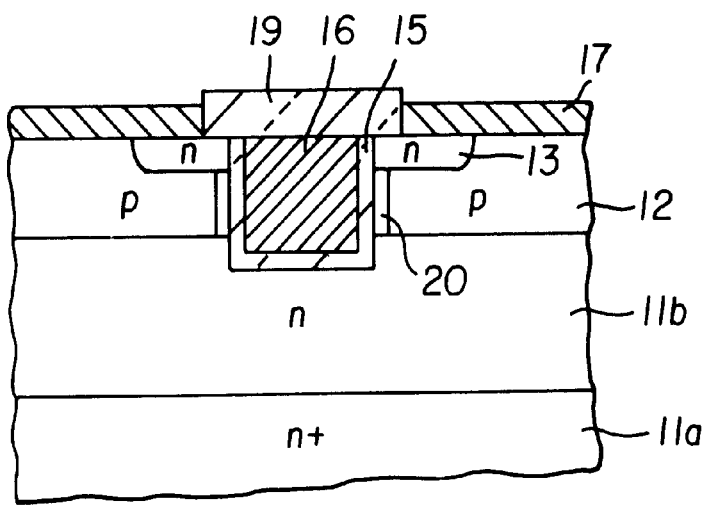
Figure 12A:
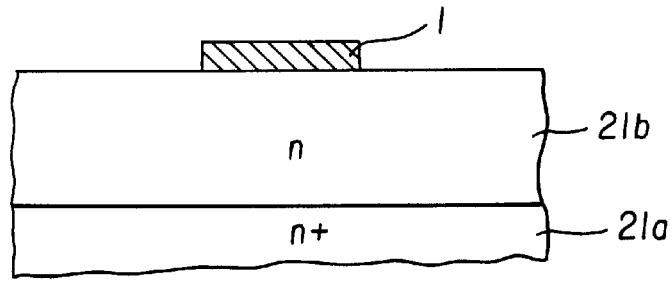
FIG. 12(a) through FIG. 12(g) are cross-sectional views showing process steps of the method for manufacturing the known planar type MOSFET.
Figure 12B:
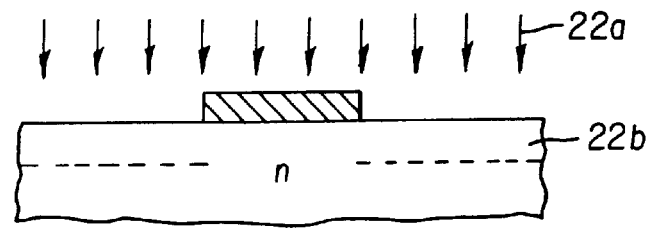
Figure 12C:
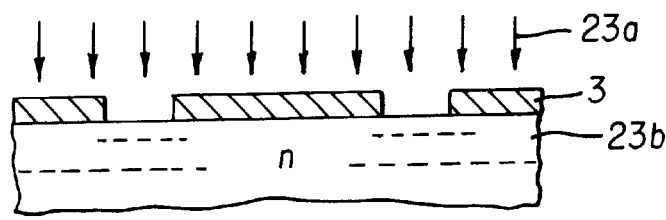
Figure 12D:
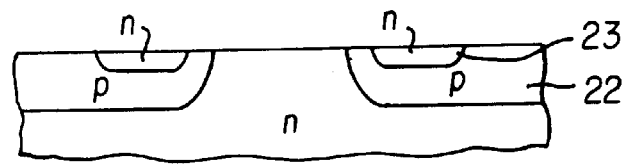
Figure 12E:
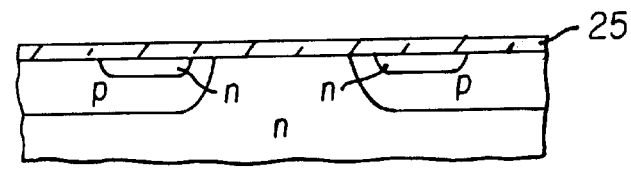
Figure 12F:
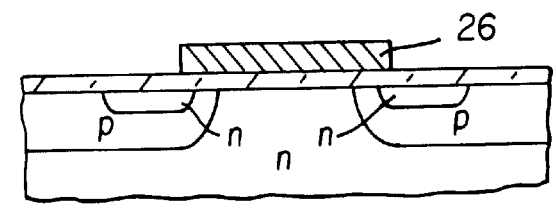
Figure 12G:
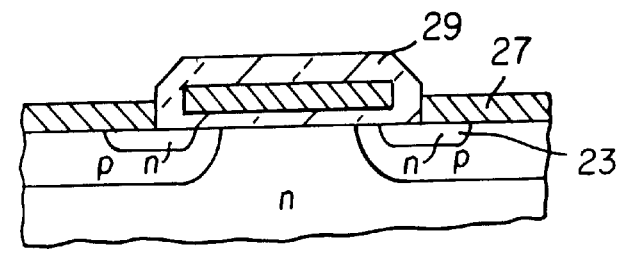

Some embodiments of the present invention will be described in detail. It is, however, to be noted that no description will be provided with respect to process steps that are similar to those of the known methods of FIG. 10 through FIG. 12, and process steps that have no relation to the present invention. Although some examples of n-channel MOSFET are illustrated as important applications of the present invention, it is to be understood that the present invention is also applicable to p-channel MOSFET in which the conductivity type is reversed.

Figure 1:
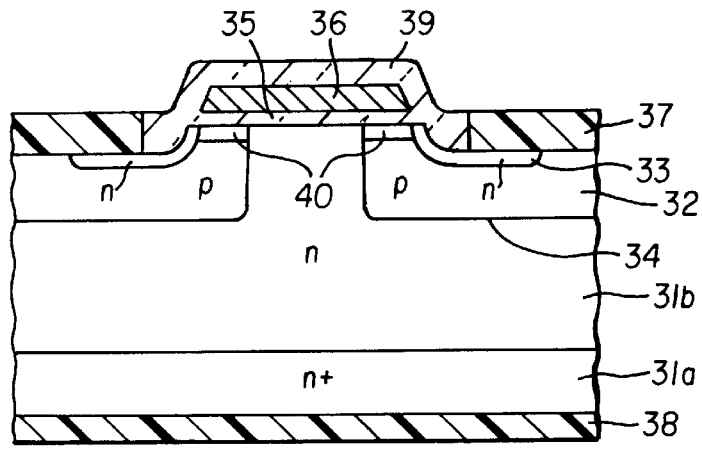
FIG. 1 is a cross-sectional view showing a MOSFET of the first embodiment of the present invention.

FIG. 1 is a cross-sectional view showing a principal part of SiC MOSFET produced according to the first embodiment of the present invention, wherein two recessed portions, two p base regions, two n source regions and two source electrodes are included.

In FIG. 1, recessed portions 34 are formed in a surface layer of n drift layer 31b which is deposited by epitaxial growth on n+ substrate 31a, and p base regions 32 doped with boron are embedded in the recessed portions 34 by epitaxial growth, while n source regions 33 are formed inside the p base regions 32 by implanting phosphorous ions. Gate electrode layer 36 formed of polycrystalline silicon is provided above exposed surface portions of the p base regions 32 and n drift layer 31b which are located between the two n source regions 33, with a gate insulating film 35 interposed between the gate electrode layer 36 and the substrate. Source electrodes 37 are formed in contact with both of the surfaces of the n source regions 33 and p base regions 32, and drain electrode 38 is formed in contact with the rear surface of the n+ substrate 31a.

Figure 9A:
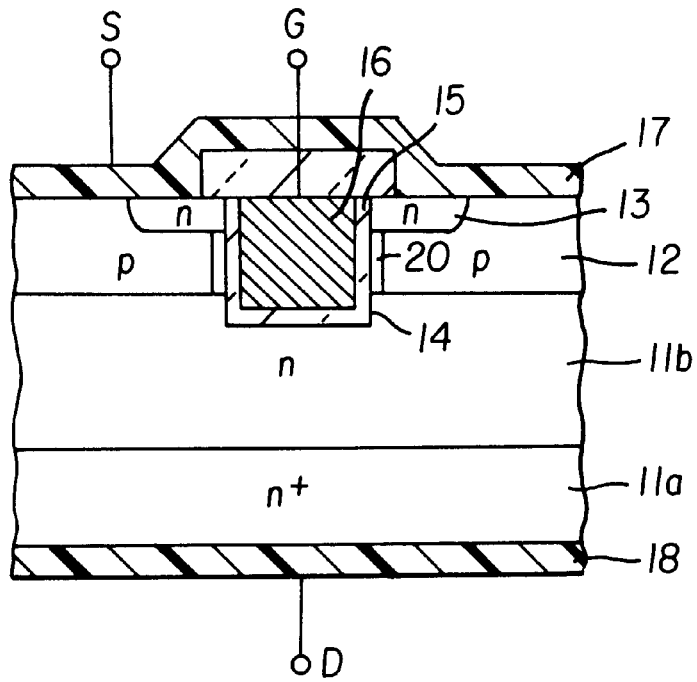
FIG. 9(a) is a cross-sectional view showing a known trench-type MOSFET.
Figure 9B:
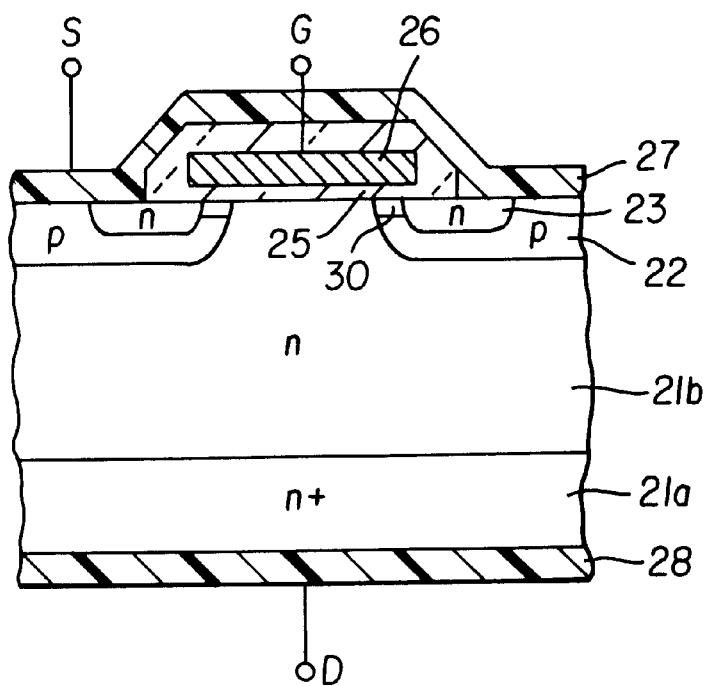
FIG. 9(b) is a cross-sectional view showing a known planar type MOSFET.
Figure 10A:
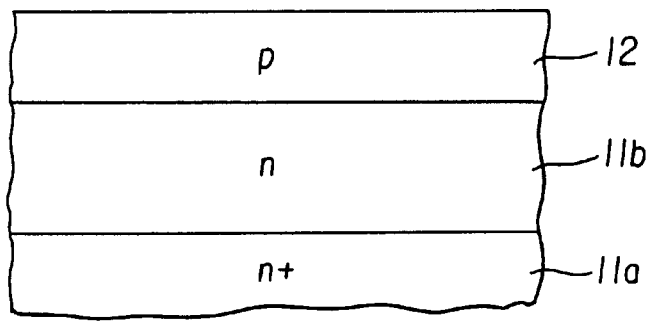
FIG. 10(a) through FIG. 10(e) are cross-sectional views showing process steps of a method for manufacturing the known trench type MOSFET.
Figure 10B:
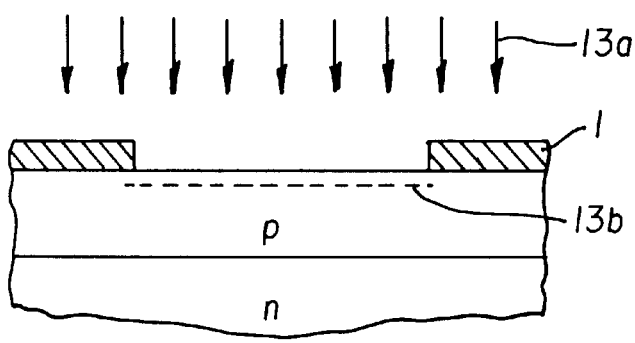
Figure 10C:
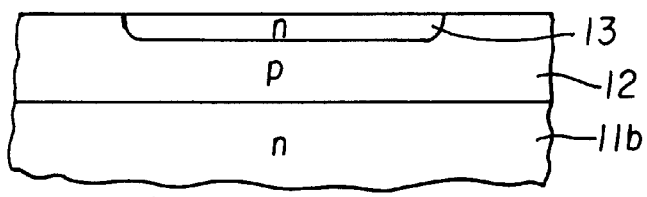
Figure 10D:
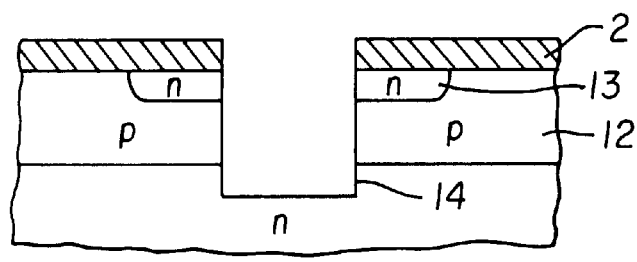
Figure 10E:
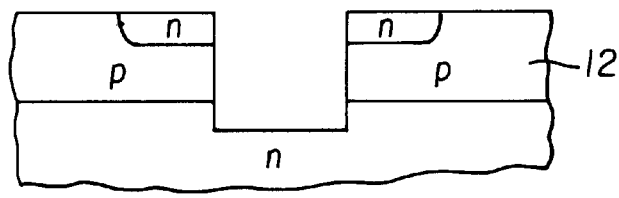

The SiC MOSFET of the present embodiment is different from the known planar type MOSFET of FIG. 9(b) in that the p base regions 32 are formed by epitaxial growth with an increased thickness. Although the height of the surface of the SiC substrate located below the gate electrode layer 36 is different from that of the surface of the SiC substrate located under the source electrodes 37, this difference shown in FIG.

1 is intended for emphasizing a difference between the methods of manufacturing the devices of FIG. 1 and FIG. 9(b), and thus the height of the SiC substrate surface does not necessarily differ from portion to portion in the manner as shown in FIG. 1.

The operation of the SiC MOSFET is substantially the same as that of the MOSFET of FIG. 9(b). Namely, when a voltage is applied to the gate electrode layer 36 on the gate insulating film 35, channels 40 are induced in surface portions of the p base regions 32, and the n source regions 33 and the n drift layer 31b are electrically shortened. As a result, current flows from the drain electrode 38 to the source electrodes 37. Thus, the SiC MOSFET of the present embodiment is of the same enhancement type as that of FIG. 9(b).

FIG. 2(a) through FIG. 2(f) and FIG. 3(a) through FIG. 3(e) are cross-sectional views showing a process of manufacturing the SiC MOSFET of the first embodiment of FIG. 1, in particular, a process of forming a junction structure, as in FIGS. 12(a) through FIG. 12(g). In the following, the process will be described step by step.

Figure 2A:
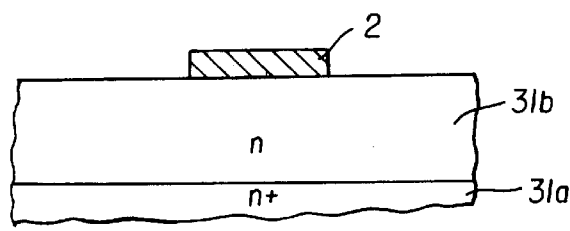
FIG. 2(a) through FIG. 2(f) are cross-sectional views showing process steps of a method of manufacturing the MOSFET according to the first embodiment of the invention.

Initially, n drift layer 31a doped with phosphorous is laminated by epitaxial growth on $n^+$ substrate 31a, to provide a 4H-SiC substrate. For instance, the n drift layer 31b has an impurity concentration of $1 \times 10^{16}$ cm$^{-3}$ and a thickness of 15 μm. Aluminum film 2 is deposited by sputtering on the surface of the n drift layer 31b, and patterned by photolithography, to provide a mask used for etching, as shown in FIG. 2(a). The aluminum film 2 has a thickness of 1 μm and a width of 10 μm.

Figure 2B:
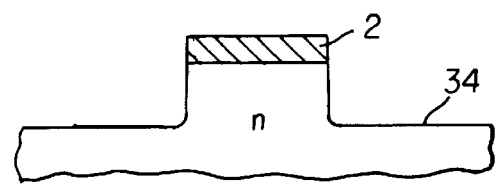

Using the aluminum film 2 as a mask, recessed portions 34 having a depth of about 3 μm are formed by RIE (reactive ion etching) using a mixed gas of carbon tetrafluoride and oxygen, as shown in FIG. 2(b). The etching mask is not necessarily formed from the aluminum film, but may be formed from an oxide film, polysilicon film, or a photoresist, provided the mask can be used for etching a selected region or regions of the substrate.

Figure 2C:
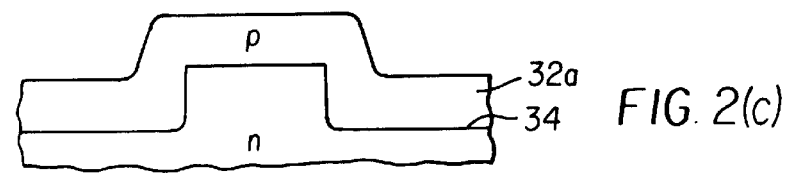

After removing the aluminum film 2 used as a mask, p epitaxial layer 32a doped with boron is deposited by epitaxial growth, as shown in FIG. 2(c). The impurity concentration of the p epitaxial layer 32a is about $5 \times 10^{16}$ cm$^{-3}$. Although the p epitaxial layer 32a illustrated in FIG. 2(c) has a thickness that is smaller than the depth of the recessed portions 34 in FIG. 2(c), the thickness of the epitaxial layer 32a may be larger than the depth of the recessed portions 34.

Figure 2D:
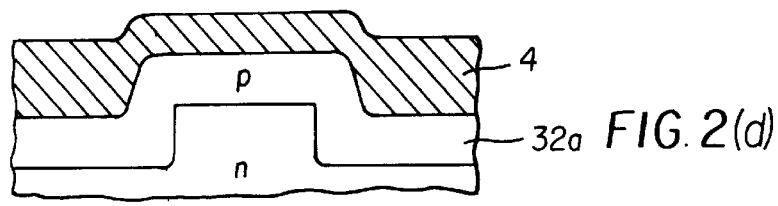

In the next step, the surface of the p epitaxial layer 32a is coated with a photoresist 4, as shown in FIG. 2(d), such that the photoresist 4 has a relatively thin portion formed on a protruding portion of the SiC substrate, and a relatively thick portion formed on recessed portions of the substrate.

Figure 2E:
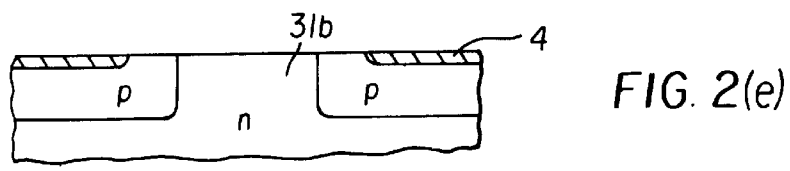

Subsequently, the photoresist 4 and the p epitaxial layer 32a on a protruding portion of the n drift layer 31b are subjected to resistive ion etching using a mixed gas of carbon tetrafluoride ($CF_4$) and oxygen ($O_2$), until the n drift layer 31b is exposed to the outside of the substrate, under etching conditions that are controlled so that the photoresist 4 and the protruding portion of the SiC substrate are etched at substantially the same etching rate. At the same time, the surface of the SiC substrate is flattened as shown in FIG. 2(e), so that protrusions and recesses are reduced to be as small as possible, for example, 0.1 to 0.2 μm. The flattening of the substrate surface may be accomplished by mechanical or chemical/mechanical polishing.

Figure 2F:
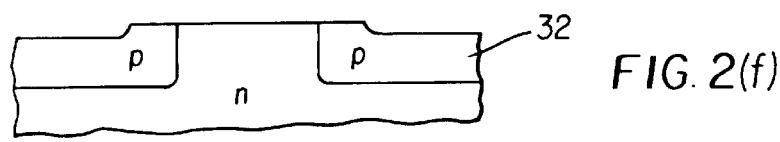

As a result of etching, the p epitaxial layer 32a is separated into p base regions 32. The photoresist 4 that remains on the p base regions 32 is then removed, as shown in FIG. 2(f).

Figure 3A:
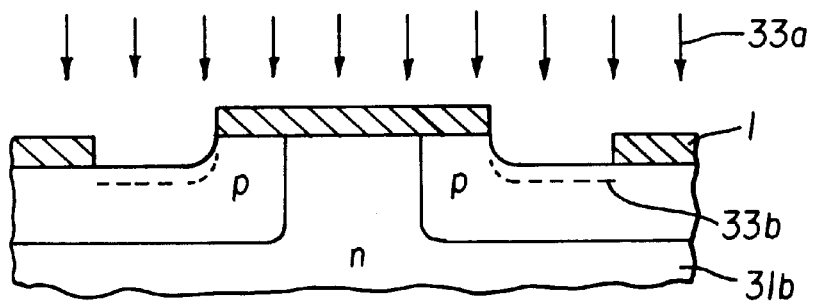
FIG. 3(a) through FIG. 3(e) are cross-sectional views showing process steps of the method of manufacturing the MOSFET of the first embodiment, following the step of FIG. 2(f)

A polycrystalline silicon film 1 having a thickness of about 1 μm is deposited by reduced-pressure CVD, and patterned by photolithography, to provide a mask used for implantation of phosphorous ions. The mask needs to be made of a heat resisting material, such as polycrystalline silicon, which is able to withstand a considerably high temperature when ion implantation is carried out at a high temperature. With the polycrystalline silicon film 1 used as a mask, phosphorous ions 33a that provide n source regions are implanted into the p base regions 32, as shown in FIG. 3(a). The implantation conditions are as follows: the acceleration voltages are 20 keV and 140 keV, the dose amount is $5 \times 10^{16}$ cm$^{-2}$ in total, and the implantation temperature is 800° C. In FIG. 3(a), reference numeral 33b denotes phosphorous atoms thus implanted.

Figure 3B:
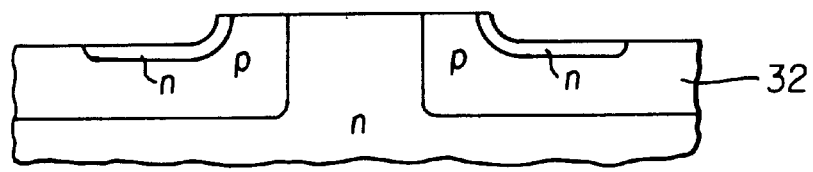

After the ion implantation, the polycrystalline silicon film 1 is removed by dry etching using a mixed gas of carbon tetrafluoride ($CF_4$) and oxygen ($O_2$), and the impurities are activated by conducting heat treatment at 1600° C. for two hours, so as to form n source regions 33, as shown in FIG. 3(b). Although the impurities hardly diffuse in the SiC substrate as stated above, the depth of junctions of the n source region 34 becomes equal to about 0.5 μm, due to an increase in the acceleration voltage.

Figure 3C:
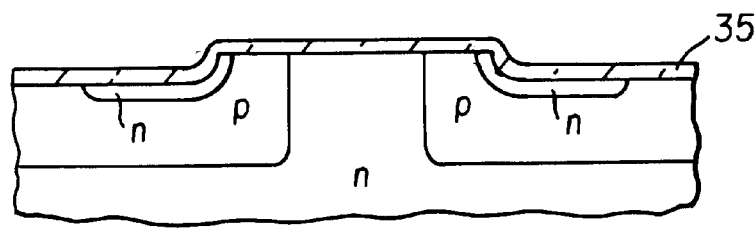
Figure 3D:
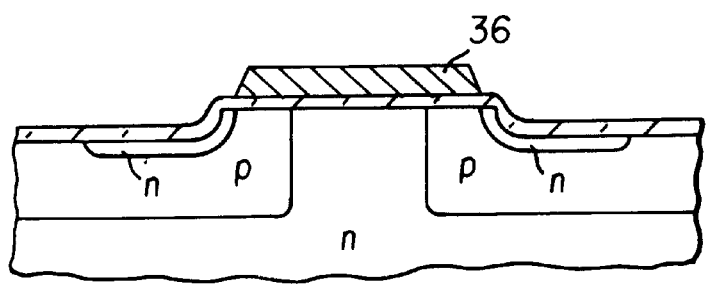

Subsequently, gate insulating film 35 having a thickness of 50 nm is formed by thermal oxidation at 1200° C. for two hours, as shown in FIG. 3(c), and about 1 μm-thickness polycrystalline silicon film is deposited on the gate insulating film 35 by reduced-pressure CVD, and patterned by photolithography, to thus provide a gate electrode layer 36, as shown in FIG. 3(d).

Figure 3E:
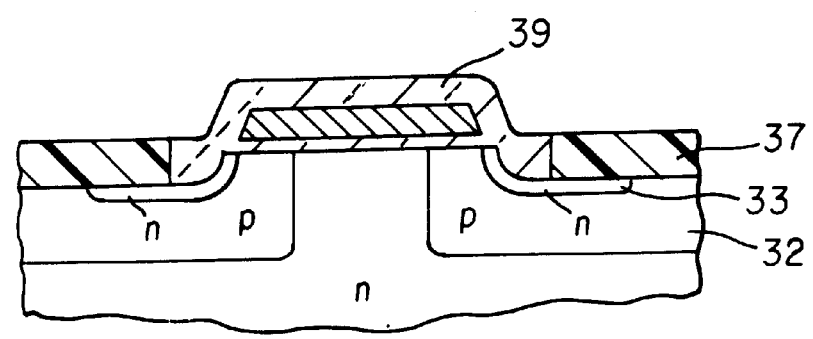

After covering the surface of the SiC substrate with interlayer insulating film 39, such as phosphorous glass, openings or windows are formed through the interlayer insulating film 39 and gate insulating film 35, and aluminum alloy is vapor-deposited and patterned to form source electrodes 37 and a gate electrode (not illustrated), as shown in FIG. 3(e). In the meantime, drain electrode is formed on the rear surface of $n^+$ substrate formed below the n drift layer 31b. Thus, the process for fabricating the SiC MOSFET is completed.

According to the manufacturing method as described above, planar type MOSFET having pn junctions exposed to the surface of the SiC substrate can be advantageously produced. The planar type MOSFET thus produced is free from the problem encountered in known trench-type silicon carbide MOSFET, namely, the problem of stresses on the gate insulating film due to an electric field applied thereto.

Since the p base regions 32 are formed by epitaxial growth, it is not necessary to implant ions of p type impurities, which have been found difficult to implant and activate. In addition, a high-pressure ion implanting apparatus is not required, and the problem of radioactive rays does not arise.

By forming the p base regions 32 by epitaxial growth, the depth of the p base regions 32 can be increased, and the concentration gradient can be suitably controlled so that no concentration of an electric field results from its structure. Thus, MOSFET having a high breakdown voltage of 1500 V or higher can be easily produced according to the method of the present embodiment.

Some variations of the above manufacturing method may be considered. For example, the heat treatment after ion implantation for forming the n source regions 33 may be conducted at a relatively low temperature around 1200° C., considering that the activation rate or degree of implanted ions is reduced to a fraction of its normal value when the substrate is annealed at 1600° C. If the heat treatment is conducted at a low temperature, the MOSFET can be produced by implanting n type ions after growing and flattening a p epitaxial layer, forming a gate insulating film, and forming a gate electrode layer. It is also possible to form n source region(s) over a large area of the substrate, and etch a part or parts of the region(s), so that the source electrodes 37 are brought into contact with the p base regions 32.

FIG. 4(a) through FIG. 4(f) are cross-sectional views showing process steps of another method of manufacturing a silicon carbide MOSFET according to the second embodiment of the invention. This embodiment is a modified example of the first embodiment.

Figure 4A:
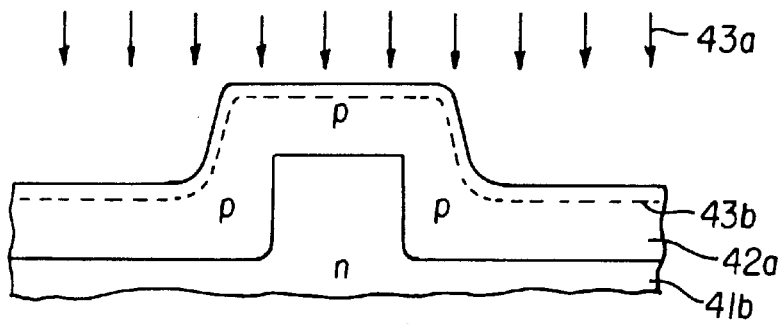
FIG. 4(a) through FIG. 4(f) are cross-sectional views showing a method of manufacturing a MOSFET according to the second embodiment of the present invention.

Immediately after recessed portions 44 are formed and p epitaxial layer 42a is deposited in the same manner as in the first embodiment, phosphorous ions 43a for forming n source regions are implanted, as shown in FIG. 4(a). The conditions for implanting ions are the same as those of the first embodiment. In FIG. 4(a), reference numeral 43b denotes phosphorous atoms thus implanted.

Figure 4B:
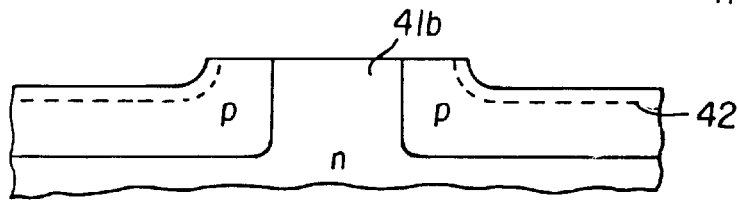
Figure 4C:
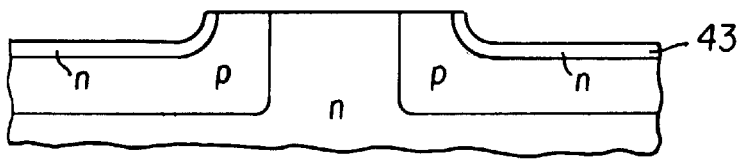

The SiC substrate thus formed is flattened in the same manner as in the first embodiment, so that the top face of n drift layer 41b is exposed to the outside of the substrate, as shown in FIG. 4(b). As a result, the p epitaxial layer 42a is separated into two p base regions 42. Then, heat treatment is conducted at 1600° C. for 30 min. so as to activate implanted phosphorous atoms to form n source regions 43, as shown in FIG. 4(c).

Figure 4D:
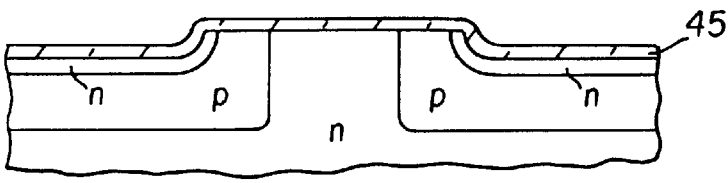
Figure 4E:
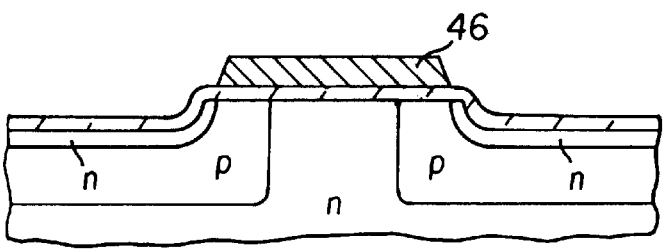

Then, gate insulating film 45 having a thickness of 50 nm is formed by thermal oxidation at 1200° C. for two hours, as shown in FIG. 4(d), and about 1 μm-thickness polycrystalline silicone film is deposited by reduced-pressure CVD, and patterned by photolithography, so as to provide gate electrode layer 46, as shown in FIG. 4(e).

Figure 4F:
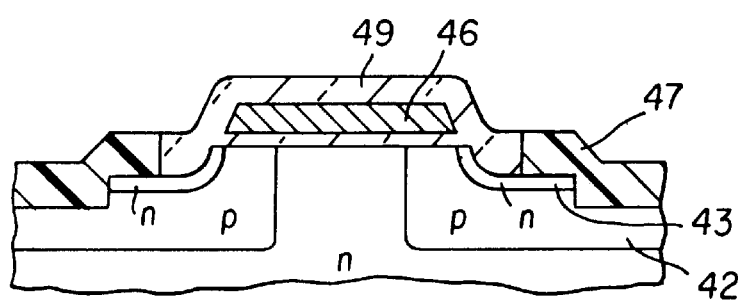

After an interlayer insulating film 49 made of phosphorous glass, or the like, is further deposited on the gate electrode layer 46 and gate insulating film 45, openings or widows are formed through the interlayer insulating film 49 and gate insulating film 45, and selected portions of the n source regions 43 and p base regions 42 are removed by digging down through an etching process. Again, openings are formed through the interlayer insulating film 49 and gate insulating film 45, and aluminum alloy is deposited and patterned, so as to form source electrodes 47 to be in contact with the n source regions 43 and p base regions 42, and a gate electrode (not illustrated), as shown in FIG. 4(f). In the meantime, drain electrode is formed on the rear surface of n+ substrate formed under the n drift layer. Thus, the process for fabricating the SiC MOSFET is completed.

While implantation of phosphorous ions for forming the n source regions is carried out after the steps of forming the p base regions by epitaxial growth and flattening the substrate in the first embodiment, the ion implantation may be carried out before these steps are executed.

As in the first embodiment, the SiC MOSFET produced in the above manner is free from the problem of excessive stresses on the gate insulating film due to an electric field applied thereto, and the p base regions can be easily formed with a sufficiently large thickness. Consequently, the MOSFET of the present embodiment provides a sufficiently high breakdown voltage.

In the SiC MOSFET produced according to the method of the first embodiment, the n source regions 33 are formed in the p base regions formed by epitaxial growth, by implanting ions in selected portions of the p base regions by use of a mask, and therefore the position of the n source regions relative to the p base regions tends to be shifted or changed, due to lack of self alignment between these regions. Since the length of channel regions is a main parameter for determining characteristics of MOSFET, it is extremely important in applications to appropriately control this parameter. In the SiC MOSFET produced according to the method of the second embodiment, the n source regions are formed over the entire areas of surface layers of the p base regions formed by epitaxial growth, and therefore self alignment is established between the p base and n source regions. Accordingly, the length of the thus formed channel regions can be controlled with high uniformity and accuracy, thus assuring stable characteristics and a high yield in the manufacture of SiC MOSFET.

In the SiC MOSFET of the second embodiment, selected portions of the n source regions 43 and p base regions 42 are removed or dug out by etching, so that the source electrodes 47 are brought into ohmic contact with the p base regions 42. If phosphorous ions for forming the n source regions 43 are implanted in selected portions of the p base regions, and boron ions are implanted in the other portions of the surface layers of the p base regions where phosphorous ions are not implanted, the source electrodes 47 may be brought into contact with the p base regions without removing parts of the n source regions 43 and p base regions 42.

FIG. 5(a) through FIG. 5(d) are cross-sectional views showing process steps of a method of manufacturing a silicon carbide MOSFET according to the third embodiment of the invention.

Initially, recessed portions 54 are formed in the same manner as in the first embodiment. The depth of the recessed portions 54 is, for example, 4 μm.

Figure 5A:
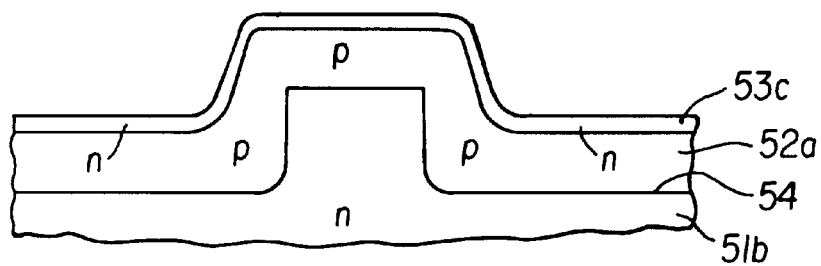
FIG. 5(a) through FIG. 5(d) are cross-sectional views showing a method of manufacturing a MOSFET according to the third embodiment of the present invention.

After formation of the recessed portions 54, p epitaxial layer 52a is formed by epitaxial growth, and n+ high concentration layer 53c is deposited on the p epitaxial layer 52a, as shown in FIG. 5(a). The dope amount of impurities in the p epitaxial layer 52a is controlled to be equivalent to that of the first embodiment, and the dope amount of impurities in the n+ high concentration layer 53c is controlled to about $5 \times 10^{19}$ cm$^{-3}$. The thickness of the p epitaxial layer 52a is about 3 μm, and the thickness of the n+ high concentration layer 53c is about 0.5 μm. In the process of the present embodiment, care should be taken to leave certain portions of the n+ high concentration layer 53c after substantially flattening the SiC substrate. To this end, the depth of the recessed portions 54 must be larger than the thickness of the epitaxial layer to be grown thereon.

Figure 5B:
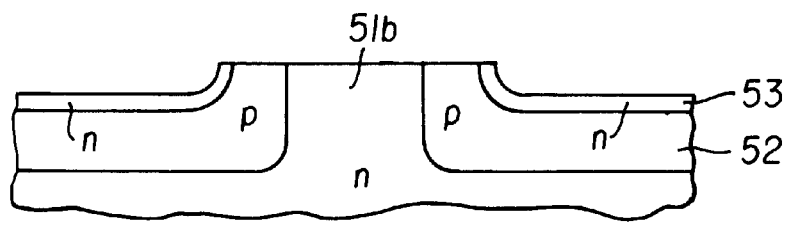

Similarly to the first embodiment, the SiC substrate is flattened so that the top face of n drift layer 51b is exposed to the outside of the substrate, and the p epitaxial layer 52a is separated into p base regions 52, as shown in FIG. 5(b). In this step, the n+ high concentration layer 53c is also separated into n source regions 53.

Figure 5C:
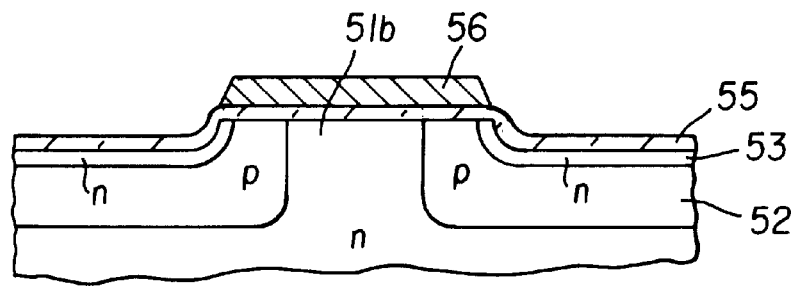

Subsequently, gate insulating film 55 having a thickness of 50 nm is formed by thermal oxidation at 1200° C. for two hours. Then, about 1 μm-thickness polycrystalline silicon film is deposited on the gate insulating film 55 by a reduced-pressure CVD method, and patterned by photolithography, so as to provide a gate electrode layer 56 that is located above the p base regions 52 between two n source regions 53 and an exposed surface portion of the n drift layer 51b, as shown in FIG. 5(c).

Figure 5D:
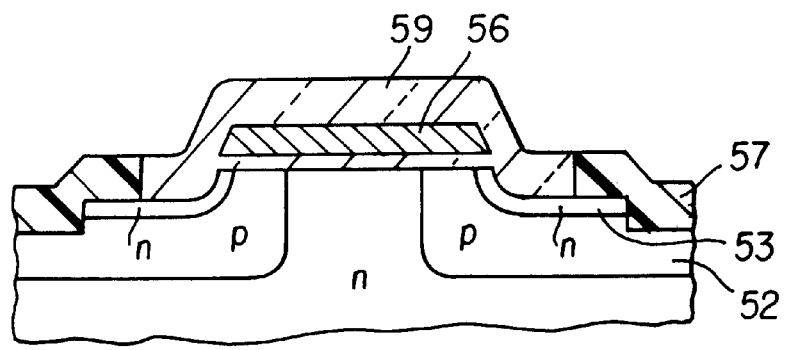

After interlayer insulating film 59 made of phosphorous glass, or the like, is further deposited on the gate electrode layer 56 and the gate insulating film 55, openings or windows are formed through the interlayer insulating film 59 and gate insulating film 55, and aluminum alloy is deposited and patterned, so as to provide source electrodes 57 and a gate electrode (not illustrated), as shown in FIG. 5(d). Also, drain electrode is formed on the rear surface of an n+ substrate formed under the n drift layer 51b. Thus, the process of fabricating the MOSFET is completed. In this embodiment, too, selected portions of the n source regions 53 are removed or dug out by etching, so that the source electrodes 57 are brought into contact the p base regions 52.

In the MOSFET produced according to the method of the third embodiment, the n source regions 53 are formed in the surface layers of the p base regions such that self alignment is established between the n source and p base regions, and therefore, the length of channels formed in the p base regions can be controlled with high uniformity and accuracy, as in the second embodiment, thus assuring stable characteristics of the SiC MOSFET and a high yield in the manufacture thereof As is understood from the process as described above, the channel length can be controlled by adjusting the thickness of the epitaxial layer.

Furthermore, since the process of the present embodiment does not use ion implantation, it is not necessary to implant ions at a high temperature or conduct heat treatment at a high temperature. Thus, the present method does not require expensive manufacturing equipment, and assures a considerably high efficiency with which the MOSFETs are produced in large quantity.

The above-described process provides a planar type MOSFET, which is free from the problem encountered in known trench-type carbon silicon MOSFET, that is, the problem of stresses imposed on the gate insulating film due to an electric field applied thereto. Also, the p base regions can be formed with a sufficiently large thickness, and the concentration gradient can be appropriately controlled, so that the resulting MOSFET provides a sufficiently high breakdown voltage, for example, about 1500V or higher.

FIG. 6(a) through FIG. 6(e) are cross-sectional view showing process steps of a method of manufacturing a silicon carbide MOSFET according to the fourth embodiment of the present invention.

Figure 6A:
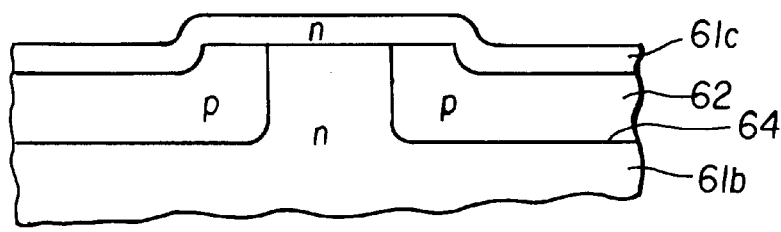
FIG. 6(a) through FIG. 6(e) are cross-sectional views showing a method of manufacturing a MOSFET according to the forth embodiment of the present invention.

The first few process steps up to the flattening step are the same as those of the first embodiment. After flattening the SiC substrate, n epitaxial layer 61c is laminated on the flattened substrate by epitaxial growth, as shown in FIG. 6(a). The n epitaxial layer 61c has an impurity concentration of about $5 \times 10^{15}$ cm$^{-3}$ and a thickness of about 0.5 $\mu$m.

Figure 6B:
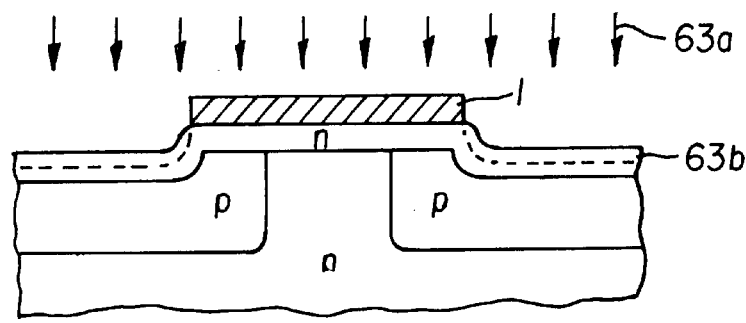

In the next step, polycrystalline silicon film 1 is deposited on the n epitaxial layer 61c by reduced-pressure CVD, and patterned by photolithography, to thus provide a mask to be used during implantation of phosphorous ions. The mask needs to be formed of a heat resisting material, such as polycrystalline silicon, which is able to withstand high temperature, if ion implantation is carried out at a high temperature. Using the mask thus formed, phosphorous ions 63a for forming n source regions are implanted, as shown in FIG. 6(b). The implantation conditions are as follows: the acceleration voltages are 20 keV and 100 keV, the dose amount is $5 \times 10^{16}$ cm$^{-2}$ in total, and the implantation temperature is 800° C. In FIG. 6(b), reference numeral 63b denotes phosphorous atoms thus implanted.

Figure 6C:
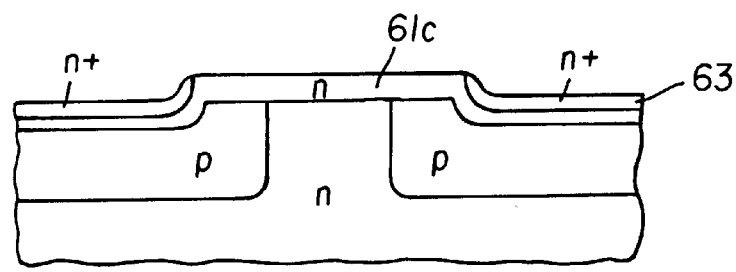

After the ion implantation, the polycrystalline silicon film 1 is removed by dry etching using a mixed gas of carbon tetrafluoride (CF$_4$) and oxygen (O$_2$), and the impurities are activated by heat treatment conducted at 1600° C. for two hours, so as to form n+ source regions 63 in a surface layer of the n epitaxial layer 61c, as shown in FIG. 6(c). Although impurities hardly diffuse in the SiC substrate as stated above, the depth of junctions of the n+ source regions 63 becomes equal to about 0.3 $\mu$m.

Figure 6D:
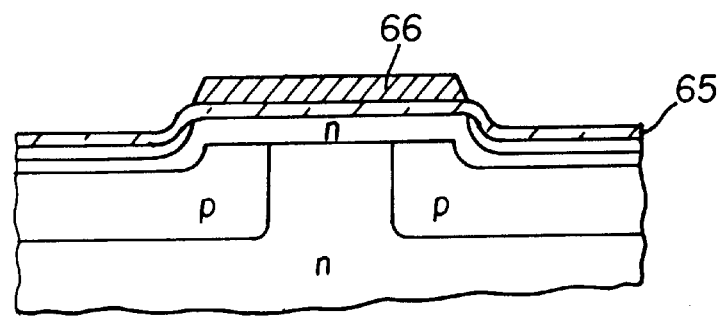

Subsequently, gate insulating film 65 having a thickness of 50 nm is formed by thermal oxidation at 1200° C. for two hours, and about 1 $\mu$m-thickness polycrystalline silicon film is deposited on the gate insulating film 65 by reduced-pressure CVD, and patterned by photolithography, so as to provide gate electrode layer 66, as shown in FIG. 6(d).

Figure 6E:
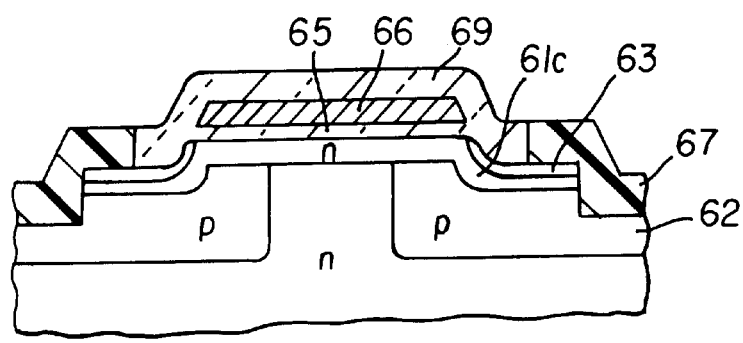

After covering the surface of the SiC substrate with interlayer insulating film 69, such as phosphorous glass, openings are formed through the interlayer insulating film 69, and selected portions of the n+ source regions 63 and n epitaxial layers 61c are removed or dug out by etching. Again, openings are formed through the interlayer insulating film 69, and aluminum alloy is vapor-deposited and patterned so as to form source electrodes 67 to be in contact with the n+ source regions 63 and p base regions 62, and a gate electrode (not illustrated), as shown in FIG. 6(e). In the meantime, drain electrode is formed on the rear surface of n+ substrate formed under the n epitaxial layer 61c. Thus, the process for fabricating the SiC MOSFET is completed.

The SiC MOSFET produced according to the method of the fourth embodiment is of depletion type, unlike those of the first through third embodiments. Namely, a channel region is formed in the n epitaxial layer 61c, and the drain and the source are conducted to each other while a voltage is not applied to the gate electrode. When a negative voltage is applied to the gate electrode, the drain and the source are disconnected from each other.

The MOSFET produced according to the fourth embodiment is also of planar type, and is thus free from the problems as encountered in known trench-type carbon silicon MOSFET, namely, the problem of stresses on the gate insulating film due to an electric field applied thereto, and the problem arising from ion implantation at a high temperature. Also, the p base regions can be formed with a sufficiently large thickness, and the concentration gradient can be appropriately controlled, so that the resulting MOSFET provides a sufficiently high breakdown voltage.

Moreover, since a damaged layer whose surface has numerous crystal defects introduced in the flattening step is not used to provide a main channel region through which current flows, the operation of the MOSFET is stabilized, and the ON-state resistance can be advantageously reduced.

FIG. 7(a) through FIG. 7(d) are cross-sectional views showing process steps of a method for manufacturing a silicon carbide MOSFET according to the fifth embodiment of the present invention. The process will be described below step by step.

The first few process steps up to the step for forming recessed portions are the same as those of the first embodiment. The depth of the recessed portions 74 is, for example, 4 $\mu$m.

Figure 7A:
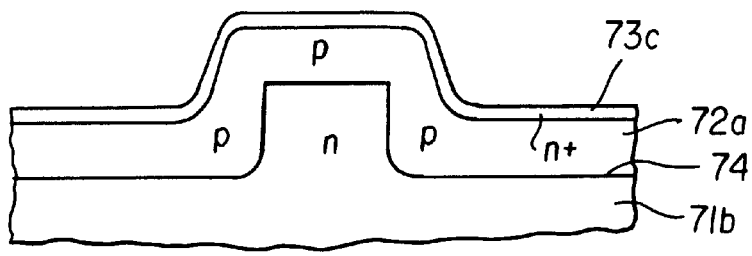
FIG. 7(a) through FIG. 7(d) are cross-sectional views showing a method of manufacturing a MOSFET according to the fifth embodiment of the present invention.

After forming the recessed portions, p epitaxial layer 72a is formed by epitaxial growth, and n+ high concentration layer 73c is deposited on the p epitaxial layer 72a, as shown in FIG. 7(a). The dope amount of impurities in the p epitaxial layer 72a is controlled to be equivalent to that of the first embodiment, and the dope amount of impurities in the n+ high concentration layer 73c is controlled to about $5 \times 10^{19}$ cm$^{-3}$. The thickness of the p epitaxial layer 72a is about 3 $\mu$m, and the thickness of the n+ high concentration layer 73c is about 0.5 $\mu$m. In the process of the present embodiment, care should be taken to leave certain portions of the n+ high concentration layer 73 after flattening the SiC substrate. To this end, the depth of the recessed portions 74 must be larger than the thickness of the epitaxial layer to be grown therein.

Figure 7B:
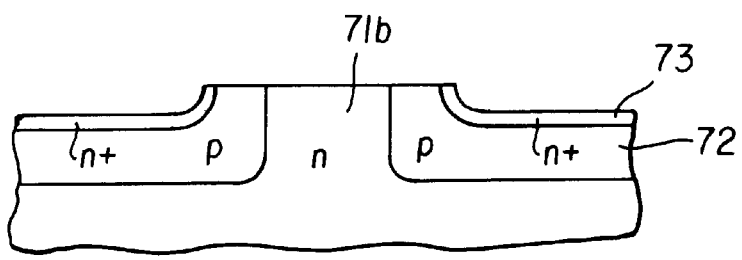

Similarly to the first embodiment, the SiC substrate is flattened so that the top face of n drift layer 71b is exposed to the outside of the substrate, and the p epitaxial layer 72a is separated into p base regions 72, as shown in FIG. 7(b). In this step, the n+ high concentration layer 73c is also separated into n source regions 73.

Figure 7C:
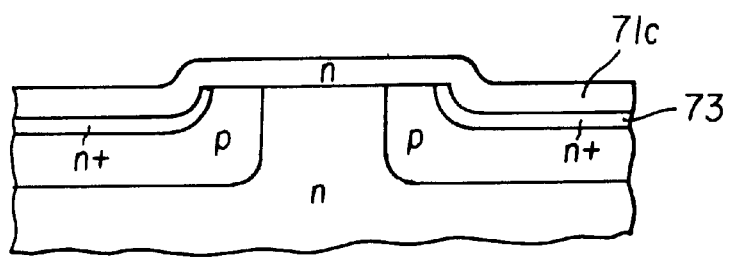

In the next step, n epitaxial layer 71c is laminated on the SiC substrate by epitaxial growth, as shown in FIG. 7(c). The n epitaxial layer 71c has an impurity concentration of $5 \times 10^{15}$ cm$^{-3}$ and a thickness of 0.5 $\mu$m. The purpose of forming the n epitaxial layer 71c is to avoid using a damaged layer whose surface has numerous crystal defects introduced in the flattening step, as a main portion through which current flows.

Figure 7D:
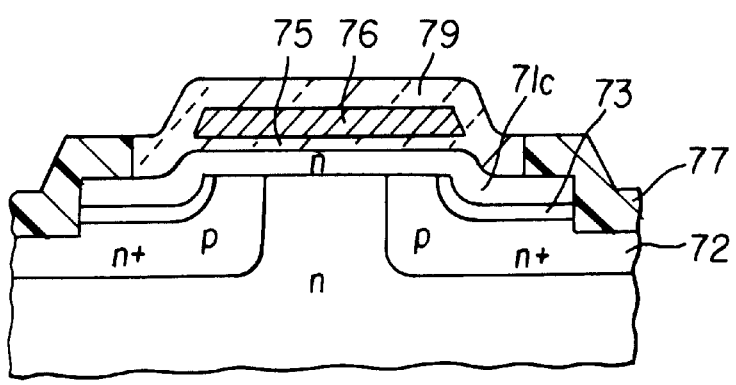

Subsequently, gate insulating film 75 having a thickness of 50 nm is formed by thermal oxidation at 1200° C. for two hours. Then, about 1 $\mu$m-thickness polycrystalline silicon film is deposited on the gate insulating film 75 by reduced-pressure CVD, and patterned by photolithography, so as to provide a gate electrode layer 76. After covering the surface of the SiC substrate with interlayer insulating film 79 made of phosphorous glass, or the like, openings or windows are formed through the interlayer insulating film 79, and selected portions of the n epitaxial layer 71c and n source regions 73 are removed by etching. Again, openings are formed through the interlayer insulating film 79, and aluminum alloy is vapor-deposited and patterned so as to form source electrodes 77 to be in contact with the n source regions 73 and p base regions 72, as shown in FIG. 7(d). In the meantime, drain electrode is formed on the rear surface of n+ substrate formed under the n drift layer 71b. Thus, the process for fabricating the SiC MOSFET is completed.

The MOSFET of the fifth embodiment is also of depletion type, though it is produced by a manufacturing method that is slightly different from that of the fourth embodiment.

Since the process of the present embodiment does not use ion implantation, high-temperature heat treatment need not be carried out, and expensive manufacturing equipment is not required. Further, the n source regions 73 are formed by self alignment in surface layers of the p base regions 72, and the length of a channel region can be controlled with high uniformity and accuracy, thus assuring stable characteristics and a high yield. As is understood from the process as described above, the channel length can be suitably controlled by adjusting the thickness of the epitaxial layer.

The MOSFET of the present embodiment is of planar type, and is therefore free from the problem as encountered in the known trench-type carbon silicon MOSFET, namely, the problem of stresses on the gate insulating film due to an electric field applied thereto. Also, the p base regions can be formed with a sufficiently large thickness, and the concentration gradient can be appropriately controlled, so that the resulting MOSFET provides a sufficiently high breakdown voltage.

In the illustrated embodiments, the present invention is applied to vertical MOSFETs. This invention, however, is also applicable to other types of semiconductor device, since the essence of the present invention resides in formation of a recessed portion by etching, growth of an epitaxial layer in the recessed portion, and a method of forming junctions on by flattening the surface of the substrate.

As an example of other type of semiconductor device produced by the method of the present invention, a process of fabricating CMOS-IC will be now explained. FIG. 8(a) through FIG. 8(f) are cross-sectional views showing process steps of a method for producing a silicon carbide CMOS-IC according to the sixth embodiment of the present invention. The process will be described below step by step.

Figure 8A:
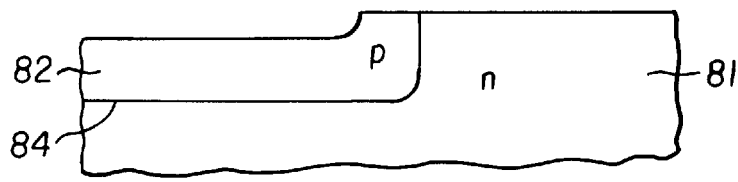
FIG. 8(a) through FIG. 8(f) are cross-sectional views showing a method of manufacturing CMOS-IC according to the sixth embodiment of the invention.

Initially, recessed portions are formed, p epitaxial layer is grown in the recessed portions, and the resulting SiC substrate is flattened, in the same manner as in the first embodiment. More specifically, recessed portions 84 are formed in a surface layer of n drift layer 81 having high resistance, and after a p epitaxial layer is grown, the surface of the substrate is flatted, so as to form p well regions 82, as shown in FIG. 8(a).

Figure 8B:
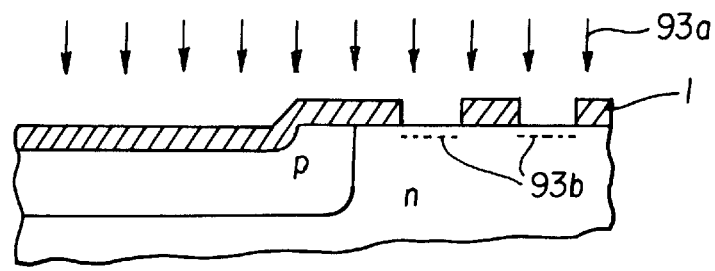

The following process steps are similar to those of a conventional process for fabricating CMOS-IC. Polycrystalline silicon film 1 is deposited by reduced-pressure CVD, and patterned by photolithography, so as to provide a mask used for implantation of boron ions. The mask needs to be formed of a material, such as polycrystalline silicon, which can withstand high temperature, if ion implantation is carried out at a high temperature. Using the polycrystalline silicon film 1 as a mask, implantation of boron ions 93a for forming p source regions and p drain regions of p channel MOSFET is carried out, as shown in FIG. 8(b). The implantation conditions are as follows: the acceleration voltages are 20 keV and 140 keV, the dose amount is $5 \times 10^{15}$ cm$^{-2}$ in total, and the implantation temperature is 800° C. In FIG. 8(b), reference numeral 93b denotes boron atoms thus implanted.

Figure 8C:
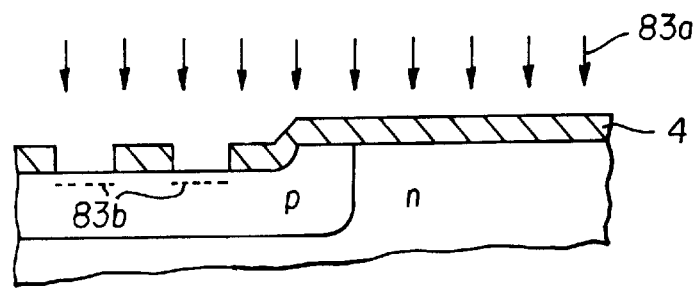
Figure 8D:
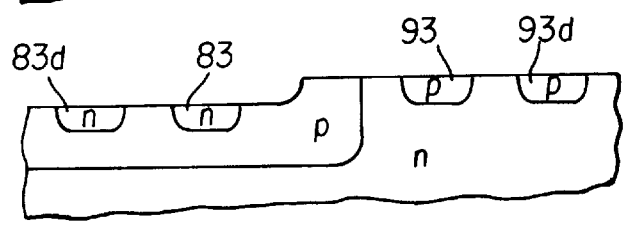

After removing the polycrystalline silicon film 1 as a mask material by dry etching using a mixed gas of carbon tetrafluoride (CF$_4$) and oxygen (O$_2$), a patterned photoresist 4 is formed on the substrate, and phosphorous ions 83 for forming n source regions and n drain regions of n channel MOSFET are implanted at room temperature, using the photoresist 4 as a mask, as shown in FIG. 8(c). The implantation conditions are as follows: the acceleration voltages are 20 keV and 140 keV, and the dose amount is $5 \times 10^{16}$ cm$^{-2}$ in total. In FIG. 8(c), reference numeral 83b denotes phosphorous atoms thus implanted.

In the next step, heat treatment is conducted at 1600° C. for two hours, so as to activate the impurities and thus form n source regions 83, n drain regions 83b, p source regions 93, and p drain regions 93b. Although the impurities hardly diffuse in the SiC substrate, as stated above, the acceleration voltage may be controlled so that the depth of junctions becomes equal to about 0.5 $\mu$m.

Figure 8E:
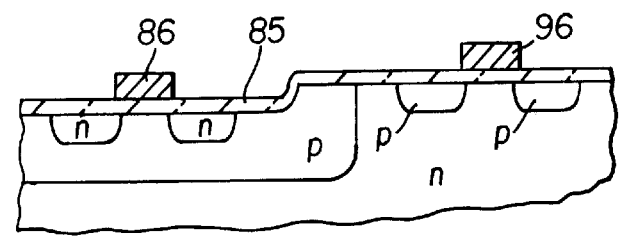

Subsequently, gate insulating film 85 having a thickness of 50 nm is formed by thermal oxidation at 1200° C. for two hours, and about 1 $\mu$m-thickness polycrystalline silicon layer is deposited on the insulating film 85 by reduced-pressure CVD, and patterned by photolithography, so as to provide gate electrode layers 86, 96, as shown in FIG. 8(e).

Figure 8F:
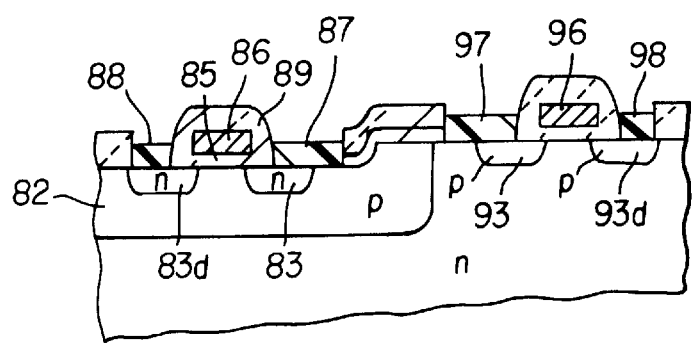

After covering the surface of the SiC substrate with interlayer insulating films 89 made of phosphorous glass, or the like, openings are formed through the interlayer insulating films 89, and aluminum alloy is vapor-deposited and patterned, so as to form source electrodes 87, 97, drain electrodes 88, 98 and a gate electrode (not illustrated), as shown in FIG. 8(f). Thus, the process of fabricating the silicon carbide CMOS-IC is completed.

In the manufacturing method as described above, deep p well regions can be easily formed, or n well regions can be formed if desired in a similar manner, in a SiC substrate in which a deep pn junction is normally difficult to form. Accordingly, CMOS-IC having a high breakdown voltage can be easily manufactured with considerably high productivity.

In order to the activation rate or degree of phosphorous ions implanted for forming the n source regions 83 and n drain regions 83*d*, ion implantation is desirably carried out at a high temperature of about 800° C. In this case, a mask used during ion implantation may be formed from a heat resisting material, such as a polycrystalline silicon film or an oxide film.

While the depth of the recessed portions is larger than the thickness of the epitaxial layer as shown in FIG. 8, the thickness of the epitaxial layer may be larger than the depth of the recessed portions. In either case, etching or polishing for flattening the substrate is carried out until the n type substrate is exposed to the outside.

While phosphorous and boron are used as n type and p type impurities, respectively, in the illustrated embodiments, nitrogen and arsenic may be used as n type impurities, and aluminum may be used as p type impurities.

In the above-described method for manufacturing a silicon carbide semiconductor device having pn junctions according to the present invention, a recessed portion is formed in a given pattern in the surface of a substrate formed of a silicon carbide crystal, and an epitaxial layer is grown on the substrate. Then, the surface of the semiconductor substrate is flattened so that pn junctions appear on the substrate surface. According to this method, pn junctions having a relatively large depth can be easily formed in the planar type semiconductor device, though it was difficult to form deep pn junctions in conventional planar type devices.

In particular, the method for manufacturing a silicon carbide MOSFET includes the steps of forming a recessed portion in a surface of a first conductivity type silicon carbide substrate in a certain pattern, growing a second conductivity type epitaxial layer on the substrate, and flattening at least a part of the substrate by removing a surface portion of the substrate including a part of the epitaxial layer grown thereon, so that pn junctions appear on a surface of the substrate, and so that the second conductivity type epitaxial layer is formed into a second conductivity type base region. The silicon carbide MOSFET produced according to this method includes planar type pn junction, and is free from the problem of stresses caused by an electric field applied to the gate insulating film, assuring high breakdown voltage.

In a modified example of the above method, the base region and source region are self-aligned with each other, so as to ensure stable characteristics and an increased yield. In another modified example, the MOSFET can be manufactured without carrying out ion implantation, assuring improved efficiency with which the devices are mass-produced.

The method of the present invention is not only applied to the manufacture of MOSFET, but may be effectively applied to the manufacture of CMOS-IC and other SiC semiconductor devices. Thus, the present method makes it easy to manufacture silicon carbide semiconductor devices which provide a sufficiently high breakdown voltage.

What is claimed is:

1. A method for manufacturing a silicon carbide semiconductor device having a pn junction, comprising the steps of:

forming a recessed portion in a surface of a semiconductor substrate in a predetermined pattern, said semiconductor substrate comprising a silicon carbide crystal;

growing an epitaxial layer on the semiconductor substrate, said epitaxial layer having a conductivity type opposite to that of the semiconductor substrate; and flattening the surface of the semiconductor substrate so that the pn junction appears on the surface of the substrate.

2. A method for manufacturing a silicon carbide MOSFET, comprising:

forming a recessed portion in a surface of a first conductivity type substrate in a predetermined pattern, said semiconductor substrate comprising a silicon carbide crystal;

growing a second conductivity type epitaxial layer on the substrate; and flattening at least a part of the substrate by removing a surface portion of the substrate including a part of the epitaxial layer grown thereon, so that pn junctions appear on a surface of the substrate, and so that the second conductivity type epitaxial layer is formed into a second conductivity type base region.

3. A method for manufacturing a silicon carbide MOSFET according to claim 2, comprising the steps of:

covering a portion of the first conductivity type silicon carbide substrate with a mask, and forming the recessed portion to a predetermined depth by etching;

growing the second conductivity type epitaxial layer on the substrate;

flattening at least a part of the substrate by removing a surface portion of the substrate including a part of the epitaxial layer grown thereon, so that pn junctions appear on the surface of the substrate, and so that the second conductivity type epitaxial layer is formed into a second conductivity type base region;

implanting impurities for forming a first conductivity type region in a surface layer of the second conductivity type epitaxial layer;

conducting heat treatment to activate the impurities introduced by ion implantation, so as to form a first conductivity type source region;

forming an oxide film on a flattened surface of the substrate by thermal oxidation;

forming a gate electrode layer on the oxide film;

forming a source electrode to be in contact with the first conductivity type source region; and forming a drain electrode to be in contact with a rear surface of the first conductivity type silicon carbide substrate.

4. A method for manufacturing a silicon carbide MOSFET according to claim 2, comprising the steps of:

covering a portion of the first conductivity type silicon carbide substrate with a mask, and forming the recessed portion to a predetermined depth by etching;

growing the second conductivity type epitaxial layer on the substrate;

implanting impurities for forming a first conductivity type region in a surface layer of the second conductivity type epitaxial layer;

flattening at least a part of the substrate by removing a surface portion of the substrate including a part of the epitaxial layer grown thereon, so that the pn junction appears on the surface of the substrate, and so that the second conductivity type epitaxial layer is formed into a second conductivity type base region;

conducting heat treatment to activate the impurities introduced by ion implantation, so as to form a first conductivity type source region;

forming an oxide film on a flattened surface of the substrate by thermal oxidation;

forming a gate electrode layer on the oxide film;

forming a source electrode to be in contact with the first conductivity type source region; and forming a drain electrode to be in contact with a rear surface of the first conductivity type silicon carbide substrate.

5. A method for manufacturing a silicon carbide MOSFET according to claim 2, comprising the steps of:
- covering a portion of the first conductivity type silicon carbide substrate with a mask, and forming the recessed portion to a predetermined depth by etching;
- epitaxially growing the second conductivity type epitaxial layer on the substrate;
- epitaxially growing a first conductivity type high concentration layer on the second conductivity type epitaxial layer;
- flattening at least a part of the substrate by removing a surface portion of the substrate including a part of the epitaxial layer grown thereon, so that the pn junction appears on the surface of the substrate, and so that the second conductivity type epitaxial layer is formed into a second conductivity type base region while the first conductivity type high concentration layer is formed into a first conductivity type source region;
- forming an oxide film on a flattened surface of the substrate by thermal oxidation;
- forming a gate electrode layer on the oxide film;
- forming a source electrode to be in contact with the first conductivity type source region; and
- forming a drain electrode to be in contact with a rear surface of the first conductivity type silicon carbide substrate.

6. A method for manufacturing a silicon carbide MOSFET according to claim 2, comprising the steps of:
- covering a portion of the first conductivity type silicon carbide substrate with a mask, and forming the recessed portion to a predetermined depth by etching;
- epitaxially growing the second conductivity type epitaxial layer on the substrate;
- flattening at least a part of the substrate by removing a surface portion of the substrate including a part of the epitaxial layer grown thereon, so that the pn junction appears on the surface of the substrate, and so that the second conductivity type epitaxial layer is formed into a second conductivity type base region;
- forming a first conductivity type epitaxial layer on the surface of the substrate;
- implanting impurities for forming a first conductivity type region in selected portions of a surface layer of the first conductivity type epitaxial layer;
- conducting heat treatment to activate the impurities introduced by ion implantation, so as to form a first conductivity type source region;
- forming an oxide film by thermal oxidation on a surface of the first conductivity type epitaxial layer;
- forming a gate electrode layer on the oxide film;
- forming a source electrode to be in contact with the first conductivity type source region; and
- forming a drain electrode to be in contact with a rear surface of the first conductivity type silicon carbide substrate.

7. A method for manufacturing a silicon carbide MOSFET according to claim 6, wherein said first conductivity type epitaxial layer has a thickness in a range of 0.1 to 1 $\mu$m.

8. A method for manufacturing a silicon carbide MOSFET according to claim 2, comprising the steps of:
- covering a portion of the first conductivity type silicon carbide substrate with a mask, and forming the recessed portion to a predetermined depth by etching;
- epitaxially growing the second conductivity type epitaxial layer on the substrate;
- laminating a first conductivity type high concentration layer by epitaxial growth on the surface of the substrate;
- flattening at least a part of the substrate by removing a surface portion of the substrate including a part of the epitaxial layer grown thereon, so that the pn junction appears on the surface of the substrate, and so that the second conductivity type epitaxial layer is formed into a second conductivity type base region while the first conductivity type high concentration layer is formed into a first conductivity type source region;
- laminating a first conductivity type epitaxial layer on the surface of the substrate;
- forming an oxide film by thermal oxidation on the surface of the first conductivity type epitaxial layer;
- forming a gate electrode layer on the oxide film;
- forming a source electrode to be in contact with the first conductivity type source region; and
- forming a drain electrode to be in contact with a rear surface of the first conductivity type silicon carbide substrate.

9. A method for manufacturing a silicon carbide MOSFET according to claim 8, wherein said first conductivity type epitaxial layer has a thickness in a range of 0.1 to 1 $\mu$m.

10. A method for manufacturing a CMOS semiconductor device, comprising the steps of:
- covering a portion of a first conductivity type silicon carbide substrate with a mask, and forming a recessed portion to a predetermined depth by etching;
- growing a second conductivity type epitaxial layer on the substrate;
- flattening at least a part of the substrate by removing a surface portion of the substrate including a part of the epitaxial layer grown thereon, so that a pn junction appears on the surface of the substrate, and so that the second conductivity type epitaxial layer is formed into a second conductivity type well region;
- implanting impurities for forming a first conductivity type region in a surface layer of the second conductivity type well region;
- conducting heat treatment to activate the impurities introduced by ion implantation, so as to form a first conductivity type source region and a first conductivity type drain region;
- implanting impurities for forming a second conductivity type region in a flattened surface layer of the first conductivity type silicon carbide substrate,
- conducting heat treatment to activate the impurities introduced by ion implantation, so as to form a second first conductivity type source region and a second conductivity type drain region;
- forming an oxide film on the surface of the substrate by thermal oxidation;
- forming gate electrode layers on the oxide film; and
- forming electrodes which are in contact with the first conductivity type source region, first conductivity type drain region, second conductivity type source region, and the second conductivity type drain region.

11. A method for manufacturing a silicon carbide semiconductor device according to any one of claims 1–10, wherein the surface of the substrate is flattened by mechanical polishing.

12. A method for manufacturing a silicon carbide semiconductor device according to any one of claims 1–10, wherein the surface of the substrate is flattened by dry etching using plasma.

* * * * *